(12) United States Patent
Li et al.

(10) Patent No.: US 7,235,499 B1
(45) Date of Patent: Jun. 26, 2007

(54) SEMICONDUCTOR PROCESSING METHODS

(75) Inventors: Weimin Li, Boise, ID (US); John Q. Li, Orem, UT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/234,233

(22) Filed: Jan. 20, 1999

(51) Int. Cl.
H01L 21/31 (2006.01)

(52) U.S. Cl. .................. 438/778; 438/779; 438/565
(58) Field of Classification Search ................ 438/118, 438/119, 612, 706, 707, 708, 709, 710, 719, 438/723, 738, 460, 463, 778, 789–783; 524/588
See application file for complete search history.

(56) References Cited

U.S. PATENT DOCUMENTS

| | | |
|---|---|---|
| 4,158,717 A | 6/1979 | Nelson |
| 4,474,975 A | 10/1984 | Clemons et al. |
| 4,600,671 A | 7/1986 | Saitoh et al. |

(Continued)

FOREIGN PATENT DOCUMENTS

| | | |
|---|---|---|
| EP | 0 471 185 A2 | 7/1991 |
| EP | 0 464 515 A3 B1 | 1/1992 |
| EP | 0 588 087 A3 | 8/1993 |
| EP | 0 588 087 A2 | 8/1993 |
| EP | 0 778 496 A2 | 5/1996 |
| EP | 0 771 886 A1 | 5/1997 |
| EP | 0942330 A1 * | 9/1999 |
| GB | 593727 | 10/1947 |
| JP | 63-157443 A | 6/1988 |
| JP | 5-263255 | 10/1993 |
| JP | 406244172 A | 9/1994 |
| JP | 09055351 | 2/1997 |
| JP | 9750993 | 2/1997 |
| JP | 06067019 A | 9/1999 |

OTHER PUBLICATIONS

TEXT: Jenkins, F. et al., "Fundamentals of Optics", Properties of Light, pp. 9–10. (No date).
TEXT: Wolf, S. et al., "Silicon Processing for the VLSI Era", vol. 1, pp. 437–441. (No date).

(Continued)

*Primary Examiner*—Dung A. Le
(74) *Attorney, Agent, or Firm*—Wells St. John P.S.

(57) ABSTRACT

In one aspect, the invention encompasses a semiconductor processing method. A layer of material is formed over a semiconductive wafer substrate. Some portions of the layer are exposed to energy while other portions are not exposed. The exposure to energy alters physical properties of the exposed portions relative to the unexposed portions. After the portions are exposed, the exposed and unexposed portions of the layer are subjected to common conditions. The common conditions are effective to remove the material and comprise a rate of removal that is influenced by the altered physical properties of the layer. The common conditions remove either the exposed or unexposed portions faster than the other of the exposed and unexposed portions. After the selective removal of the exposed or unexposed portions, and while the other of the exposed and unexposed portions remains over the substrate, the wafer is cut into separated die. In another aspect, the invention encompasses another semiconductor processing method. A layer of $(CH_3)_ySi(OH)_{4-y}$ is formed over a substrate. Some portions of the layer are exposed to ultraviolet light while other portions are not exposed. The exposure to ultraviolet light converts the exposed portions to $(CH_3)_xSiO_{2-x}$. After the exposure to ultraviolet light, the exposed and unexposed portions of the layer are subjected to hydrofluoric acid to selectively remove the $(CH_3)_ySi(OH)_{4-y}$ of the unexposed portions relative to the $(CH_3)_xSiO_{2-x}$ of the exposed portions.

31 Claims, 4 Drawing Sheets

U.S. PATENT DOCUMENTS

| | | |
|---|---|---|
| 4,648,904 A | 3/1987 | Depasquale et al. |
| 4,695,859 A | 9/1987 | Guha et al. |
| 4,702,936 A | 10/1987 | Maeda et al. |
| 4,805,683 A | 2/1989 | Magdo et al. |
| 4,833,096 A | 5/1989 | Huang et al. |
| 4,863,755 A | 9/1989 | Hess et al. |
| 4,954,867 A | 9/1990 | Hosaka |
| 4,992,306 A | 2/1991 | Hochberg et al. |
| 5,034,348 A | 7/1991 | Hartswick et al. |
| 5,061,509 A | 10/1991 | Naito et al. |
| 5,219,613 A | 6/1993 | Fabry et al. |
| 5,234,869 A | 8/1993 | Mikata et al. |
| 5,260,600 A | 11/1993 | Harada |
| 5,270,267 A | 12/1993 | Quellet |
| 5,276,347 A | 1/1994 | Wei et al. |
| 5,285,017 A | 2/1994 | Gardner |
| 5,302,366 A | 4/1994 | Schuette et al. |
| 5,314,724 A | 5/1994 | Tsukane et al. |
| 5,340,621 A | 8/1994 | Matsumoto et al. |
| 5,356,515 A | 10/1994 | Tahara et al. |
| 5,376,591 A | 12/1994 | Maeda et al. |
| 5,405,489 A | 4/1995 | Kim et al. |
| 5,441,797 A | 8/1995 | Hogan |
| 5,461,003 A | 10/1995 | Haveman |
| 5,470,772 A | 11/1995 | Woo |
| 5,472,827 A | 12/1995 | Ogawa et al. |
| 5,472,829 A | 12/1995 | Ogawa |
| 5,536,857 A | 7/1996 | Naula |
| 5,541,445 A | 7/1996 | Quellet |
| 5,554,567 A | 9/1996 | Wang |
| 5,591,494 A | 1/1997 | Sato et al. |
| 5,591,566 A | 1/1997 | Ogawa |
| 5,600,165 A | 2/1997 | Tsukamoto et al. |
| 5,641,607 A | 6/1997 | Ogawa et al. |
| 5,648,202 A | 7/1997 | Ogawa et al. |
| 5,652,187 A | 7/1997 | Kim et al. |
| 5,656,337 A | 8/1997 | Park et al. |
| 5,661,093 A | 8/1997 | Ravi et al. |
| 5,667,015 A | 9/1997 | Harestad et al. |
| 5,670,297 A | 9/1997 | Ogawa et al. |
| 5,674,356 A | 10/1997 | Nagayama |
| 5,677,015 A | 10/1997 | Hasegawa |
| 5,677,111 A | 10/1997 | Ogawa |
| 5,698,352 A | 12/1997 | Ogawa et al. |
| 5,709,741 A | 1/1998 | Akamastsu et al. |
| 5,710,067 A | 1/1998 | Foote |
| 5,731,242 A | 3/1998 | Parat et al. |
| 5,741,721 A | 4/1998 | Stevens |
| 5,744,399 A | 4/1998 | Rostoker |
| 5,753,320 A | 5/1998 | Mikoshiba et al. |
| 5,759,746 A | 6/1998 | Azuma et al. |
| 5,759,755 A | 6/1998 | Park et al. |
| 5,783,493 A | 7/1998 | Yeh et al. |
| 5,786,039 A | 7/1998 | Brouquet |
| 5,789,819 A | 8/1998 | Gnade et al. |
| 5,796,151 A | 8/1998 | Hsu et al. |
| 5,800,877 A | 9/1998 | Maeda et al. |
| 5,807,660 A | 9/1998 | Lin et al. |
| 5,831,321 A | 11/1998 | Nagayama |
| 5,838,052 A | 11/1998 | McTeer |
| 5,855,880 A | 1/1999 | Dobson et al. |
| 5,872,385 A | 2/1999 | Taft et al. |
| 5,874,367 A | 2/1999 | Dobson |
| 5,883,011 A | 3/1999 | Lin et al. |
| 5,883,014 A | 3/1999 | Chen |
| 5,948,482 A | 9/1999 | Brinker et al. |
| 5,960,289 A | 9/1999 | Tsui et al. |
| 5,962,581 A * | 10/1999 | Hayase et al. ............... 524/588 |
| 5,968,324 A | 10/1999 | Cheung et al. |
| 5,968,611 A | 10/1999 | Kaloyeros et al. |
| 6,001,741 A | 12/1999 | Alers |
| 6,008,124 A | 12/1999 | Sekiguchi et al. |
| 6,017,779 A | 1/2000 | Miyasaka |
| 6,020,243 A | 2/2000 | Wallace et al. |
| 6,022,404 A | 2/2000 | Ettlinger et al. |
| 6,028,015 A | 2/2000 | Wang |
| 6,054,379 A | 4/2000 | Yau et al. |
| 6,072,227 A | 6/2000 | Yau et al. |
| 6,080,529 A | 6/2000 | Ye et al. |
| 6,083,852 A | 7/2000 | Cheung et al. |
| 6,114,736 A | 9/2000 | Balasubra et al. |
| 6,118,163 A | 9/2000 | Gardner et al. |
| 6,124,641 A | 9/2000 | Matsura |
| 6,156,485 A | 12/2000 | Tang et al. |
| 6,156,674 A | 12/2000 | Li et al. |
| 6,159,871 A | 12/2000 | Loboda et al. |
| 6,208,004 B1 | 3/2001 | Cunningham |
| 6,727,173 B2 | 4/2004 | Sandhu et al. |

OTHER PUBLICATIONS

D.R. McKenzie et al., "New Technology for PACVD[1]", Surface and Coatings Technology, 82 (1996), pp. 326–333.

S. McClatchie et al.; "Low Dielectric Constant Flowfill® Technology For IMD Applications"; undated; 7 pages.

K. Beekmann et al.; "Sub–micron Gap Fill and In–Situ Planarisation using Flowfill[SM] Technology"; Oct. 1995; pp. 1–7.

A. Kiermasz et al.; "Planarisation for Sub–Micron Devices Utilising a New Chemistry"; Electrotech, Feb. 1995; 2 pages.

IBM Technical Disclosure Bulletin "Low–Temperature Deposition of SiO2, Si3N4 or SiO2–Si3N4," vol. 28, No. 9, p. 4170, Feb. 1986.

Article: Bencher, C. et al., "Dielectric antireflective coatings for DUV lithography", Solid State Technology (Mar. 1997), pp. 109–114.

Noboru Shibata, "Plasma–Chemical Vapor–Deposited Silicon Oxide/Silicon Oxynitride Double–Layer Antireflective Coating for Solar Cells", Japanese Journal of Applied Physics, vol. 30, No. 5, May 1991, pp. 997–1001.

Julius Grant, Hackh's Chemical Dictionary, Fourth Edition, McGraw–Hill Book Company, ©1969, rented by Grant ©1972, pp. 27.

Document No. 20029 US99 Search Report.

Document No. 20030 US99 Search Report.

Ralls, Kenneth M., "Introduction to Materials Science and Engineering", John Wiley & Sons, ©1976, pp. 312–313.

Ravi K. Lax,an, "Synthesizing Low–k CVD Materials for Fab Use", Semiconductor International, Nov. 2000, 10 pps.

Anonymous, New gas helps make faster IC's, Machine Design Cleveland, ©Penton Media, Inc., Nov. 4, 1999, pp. 118.

Lobada et al, "Using Trimethylsilane to Improve Safety Throughput and Versatility in PECVD Processes", 4th International Symposium on Silicon Nitride and Silicon Dioxide Thin Insulating Films, The Electrochemical Society, Abstract No. 358, p. 454, May 1997.

Article: Dammel, R. R. et al., "Dependence of Optical Constants of AZ® BARLi™ Bottom Coating on Back Conditions", SPIE vol. 3049 (1997), pp. 963–973.

Text: Heavens, O. S., "Optical Properties of Thin Solid Films", pp. 48–49.

U.S. application No. 09/146,842, Yin et al., filed Sep. 3, 1998.

U.S. application No. 09/146,843, Li et al., filed Sep. 3, 1998.

U.S. application No. 09/030,618, Holscher et al., filed Feb. 25, 1998.

M. Matsuura et al.; "A Highly Reliable Self–planarizing Low–k Intermetal Dielectric for Sub–quarter Micron Interconnects"; Jul. 1997; pp. 31.6.1–31.6.4.

O. Horie et al.; "Kinetics and Mechanism of the Reactions of $O(^3P)$ with $SIH_4$, $CH_3SIH_3$, $(CH_3)_2SIH_2$, and $(CH_3)_3SIH$"; The Journal of Physical Chemistry, vol. 95, No. 11, 1991; pp. 4393–4400.

Robert Withmall et al.; "Matrix Reactions of Methyisilanes and Oxygen Atoms"; The Journal of Physical Chemistry, vol. 92, No. 3, 1988; pp. 594–602.

Ajey M. Joshi et al.; "Plasma Deposited Organosilicon Hydride Network Polymers as Versatile Resists for Entirely Dry Mid–Deep UV Photolithography"; SPIE vol. 1925, 1993; pp. 709–720.

Timothy W. Weidman, at al., New Photodefinable glass etch masks for entirely dry photolithography: Plasma deposited organosilicon hydride polymers (Applied PhysicsLetters, vol. 62, No. 4, Jan. 25, 1993, pp. 372–374).*

Weidman, et al., All dry lithography: Applications of plasma polymerized methylsilane as a single layer resist and silicon dioxide precursor ( Journal of Photopolymer Science and Technology, vol. 8, No. 8, 1995, pp.679–686).*

Joubert O et al.,: Application of Plasma Polymerized Methylsilane in an all dry resistprocess for 193 and 248 nm lithography (Microelectronic Engineering, vol. 30,No. 1/04, Jan. 1, 1996, pp. 275–278.*

* cited by examiner

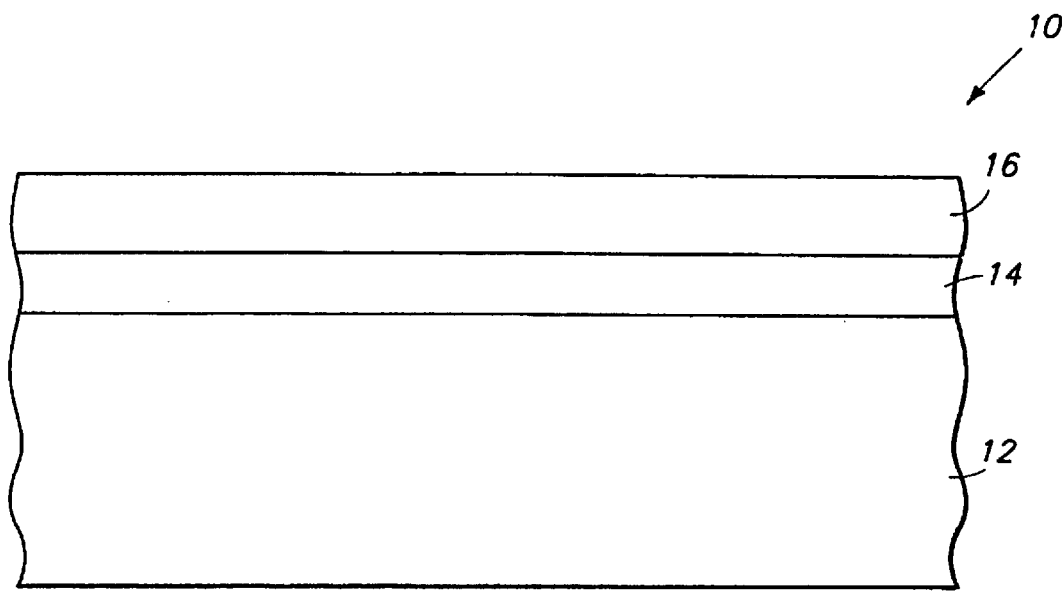
$\overline{\mathbb{H}\,\mathbb{I}\,\mathbb{G}\!\!\!\!\!\!-\,\mathbb{I}}$
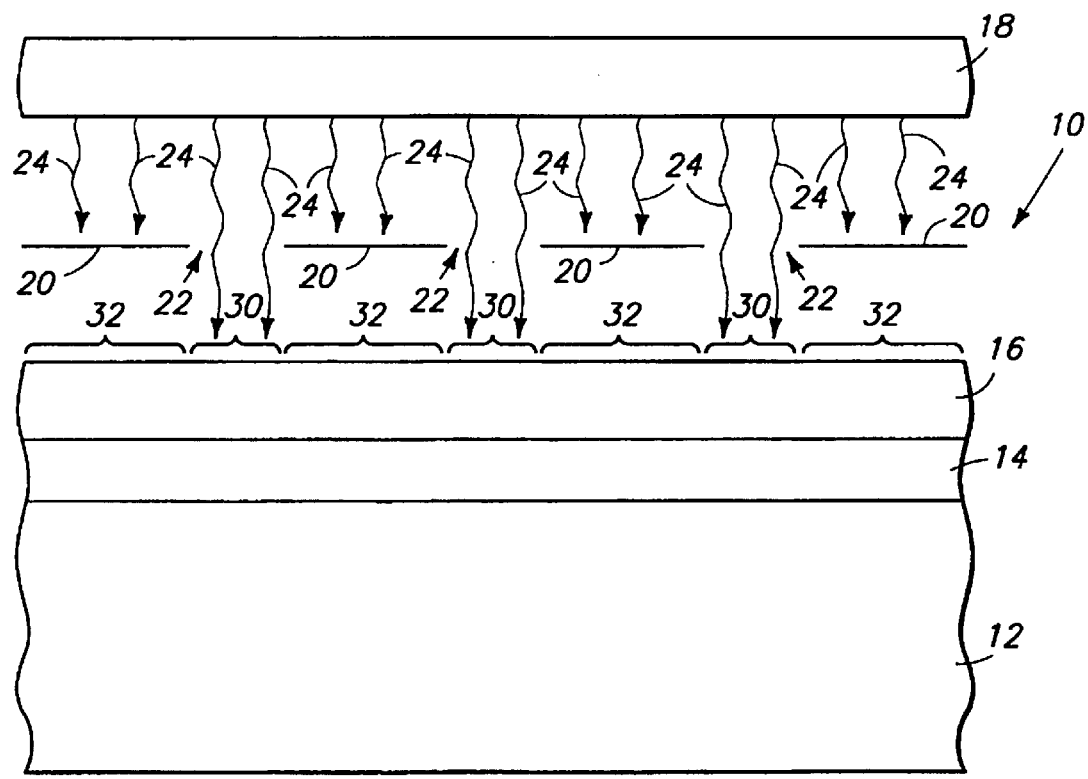
$\overline{\mathbb{H}\,\mathbb{I}\,\mathbb{G}\!\!\!\!\!\!-\,\mathbb{Z}}$

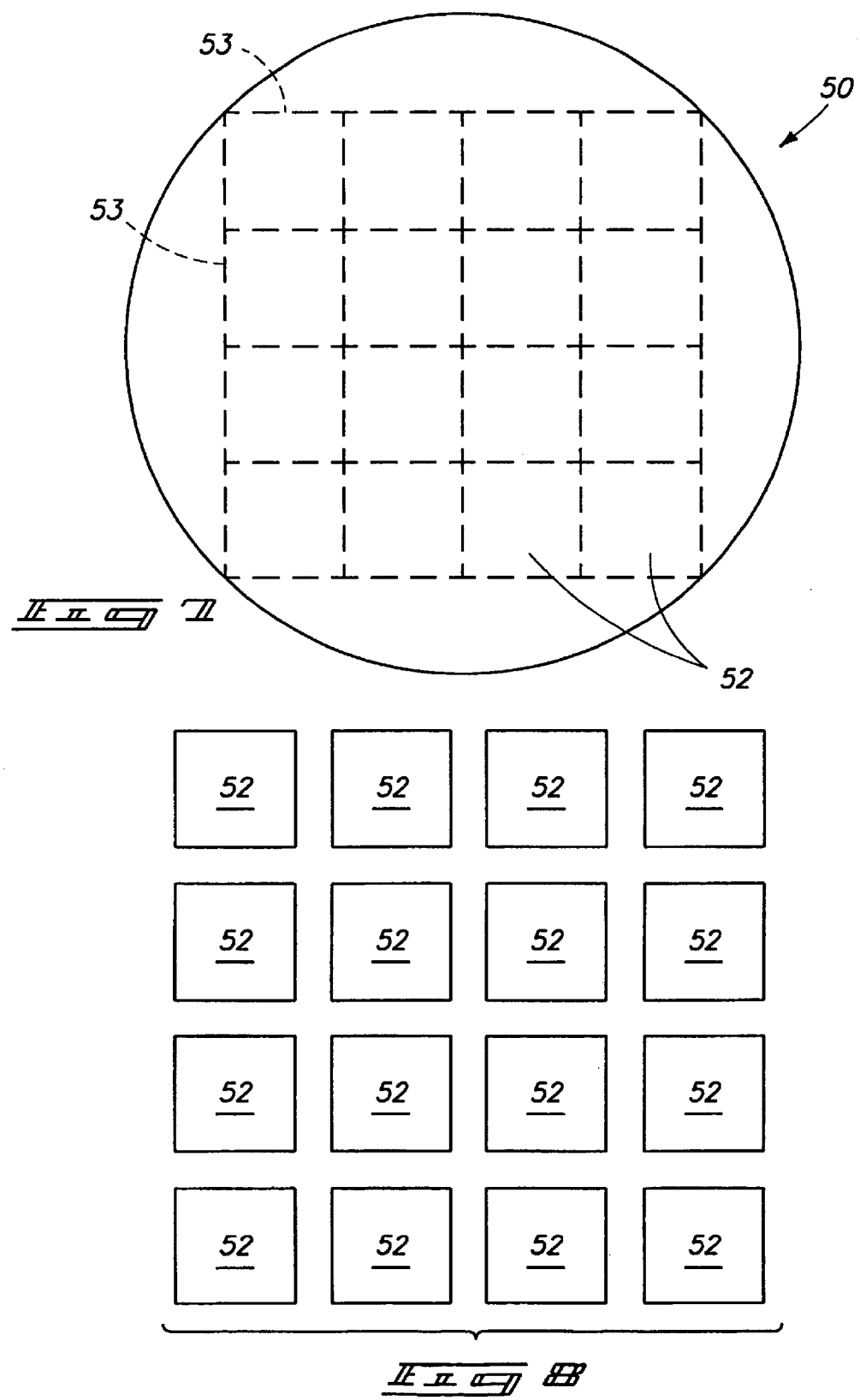

SEMICONDUCTOR PROCESSING METHODS

TECHNICAL FIELD

The invention pertains to semiconductor processing methods, and particularly pertains to methods of removing some portions of a layer from over a semiconductive substrate, while leaving other portions of the layer remaining over the substrate.

BACKGROUND OF THE INVENTION

Modern semiconductor processing frequently involves photolithographic methods to pattern materials into very small structures, which are ultimately incorporated into a semiconductor circuit. An exemplary prior art method for forming small structures from a layer of material is as follows. First, the layer of material is provided over a semiconductive substrate. Subsequently, a layer of photoresist is provided over the layer of material. A photolithographic mask is then provided over the layer of photoresist and light is shined through the mask to expose portions of the layer of photoresist while leaving other portions unexposed. The photoresist typically comprises an unsaturated organic material, such as, for example, a material comprising one or more unsaturated carbon-containing rings. The exposed portions are rendered either more or less soluble in a solvent relative to the unexposed portions. If the exposed portions are rendered more soluble, the resist is referred to as a positive photoresist (as a positive image of a pattern from the photolithographic mask is transferred to the photoresist), and if the exposed portions are rendered less soluble, the photoresist is referred to as a negative photoresist (as a negative image of the pattern from the photolithographic mask is transferred to the photoresist). In any event, the photoresist is exposed to a solvent and either the exposed or unexposed portions are removed while leaving the other of the exposed or unexposed portions remaining over the layer of material. Such patterns the photoresist into a patterned mask overlaying the layer of material. The layer of material is then exposed to conditions which transfer a pattern from the patterned mask to the layer of material (i.e., which removes portions of the layer of material not covered by photoresist, while leaving the portions of the layer material that are covered by photoresist). Subsequently, the photoresist is removed and the substrate having the patterned layer of material thereon is subjected to subsequent processing steps to form an integrated circuit over the substrate.

Typically, the semiconductive substrate referred to above is in the form of a wafer and a plurality of semiconductor packages (i.e., individual integrated circuits) are simultaneously formed over the wafer. After the formation of the plurality of semiconductor packages is complete, the wafer is subjected to a die-cutting process to separate the individual integrated circuits from one another. In wafer fabrication processes employed to date, photoresist is entirely removed from a wafer prior to subjecting the wafer to a die-cutting process. Among the reasons for removal of the photoresist is that the photoresist is not a material suitable for incorporation into semiconductor circuits. It would be desirable to develop alternative methods for patterning structures during semiconductor circuit fabrication processes.

In an area of semiconductor processing considered to be unrelated to the above-described photolithographic processing methods, a recently developed technique for forming insulative materials is Flowfill™ Technology, which has been developed by Trikon Technology of Bristol, U.K. The process can be utilized for forming either silicon dioxide or methylsilicon oxide (($CH_3)_xSiO_{2-x}$), for example. The process for forming silicon dioxide is as follows. First, $SiH_4$ and $H_2O_2$ are separately introduced into a chemical vapor deposition (CVD) chamber, such as a parallel plate reaction chamber. The reaction rate between $SiH_4$ and $H_2O_2$ can be moderated by the introduction of nitrogen into the reaction chamber. A semiconductive wafer is provided within the chamber, and ideally maintained at a suitably low temperature, such, as 0° C., at an exemplary pressure of 1 Torr to achieve formation of a silanol-type structure of the formula $Si(OH)_x$, which is predominantly $Si(OH)_4$. The $Si(OH)_4$ condenses onto the wafer surface. Although the reaction occurs in the gas phase, the deposited $Si(OH)_4$ is in the form of a viscous liquid which flows to fill small gaps on the wafer surface. In applications where deposition thickness increases, surface tension drives the deposited layer flat, thus forming a planarized layer over the substrate.

The liquid $Si(OH)_4$ is typically converted to a silicon dioxide structure by a two-step process. First, planarization of the liquid film is promoted by increasing the temperature to above 100° C., while maintaining the pressure of about 1 Torr, to result in solidification and formation of a polymer layer. Thereafter, the temperature is raised to above 400° C., while maintaining the pressure of greater than 1 Torr, to form $SiO_2$. The processing above 400° C. also provides the advantage of driving undesired water from the resultant $SiO_2$ layer.

The formation of methylsilicon oxide is accomplished similarly to that described above for forming silicon dioxide, with the exception that methylsilane (($CH_3)_zSiH_{4-z}$, wherein z is at least 1 and no greater than 4) is combined with the hydrogen peroxide to produce a methylsilanol, instead of combining the silane ($SiH_4$) with the hydrogen peroxide to form silanol.

SUMMARY OF THE INVENTION

In one aspect, the invention encompasses a semiconductor processing method wherein a layer of material is formed over a semiconductive wafer substrate. Some portions of the layer are exposed to energy while other portions are not exposed. The exposure to energy alters physical properties of the exposed portions relative to the unexposed portions. After the portions are exposed, the exposed and unexposed portions of the layer are subjected to common conditions. The common conditions are effective to remove the material and comprise a rate of removal that is influenced by the altered physical properties of the layer. The common conditions remove either the exposed or unexposed portions faster than the other of the exposed and unexposed portions. After the selective removal of the exposed or unexposed portions, and while the other of the exposed and unexposed portions remains over the substrate, the wafer is cut into separated die.

In another aspect, the invention encompasses another semiconductor processing method. A layer of ($CH_3)_ySi(OH)_{4-y}$ is formed over a substrate, wherein y is greater than 0 and less than 4. Some portions of the layer are exposed to ultraviolet light while other portions are not exposed. The exposure to ultraviolet light converts the exposed portions to ($CH_3)_xSiO_{2-x}$, wherein x is greater than 0 and less than 2. After the exposure to ultraviolet light, the exposed and unexposed portions of the layer are subjected to hydrofluoric acid to selectively remove the $(CH_3)_y Si(OH)_{4-y}$ of the unexposed portions relative to the $(CH_3)_x SiO_{2-x}$ of the exposed portions.

BRIEF DESCRIPTION OF THE DRAWINGS

Preferred embodiments of the invention are described below with reference to the following accompanying drawings.

FIG. 1 is a fragmentary, diagrammatic, cross-sectional view of a semiconductive wafer fragment at a first step of a processing method in accordance with the present invention.

FIG. 2 is a view of the FIG. 1 wafer fragment at a step subsequent to that of FIG. 1.

FIG. 7 is a top view of a semiconductive wafer, such as the wafer incorporating the fragment of FIG. 1, shown prior to subjecting the wafer to a die-cutting process.

FIG. 8 is a top view of portions of the FIG. 7 semiconductive wafer shown after the wafer is subjected to a die-cutting process.

DETAILED DESCRIPTION OF THE PREFERRED EMBODIMENTS

Figure 3:
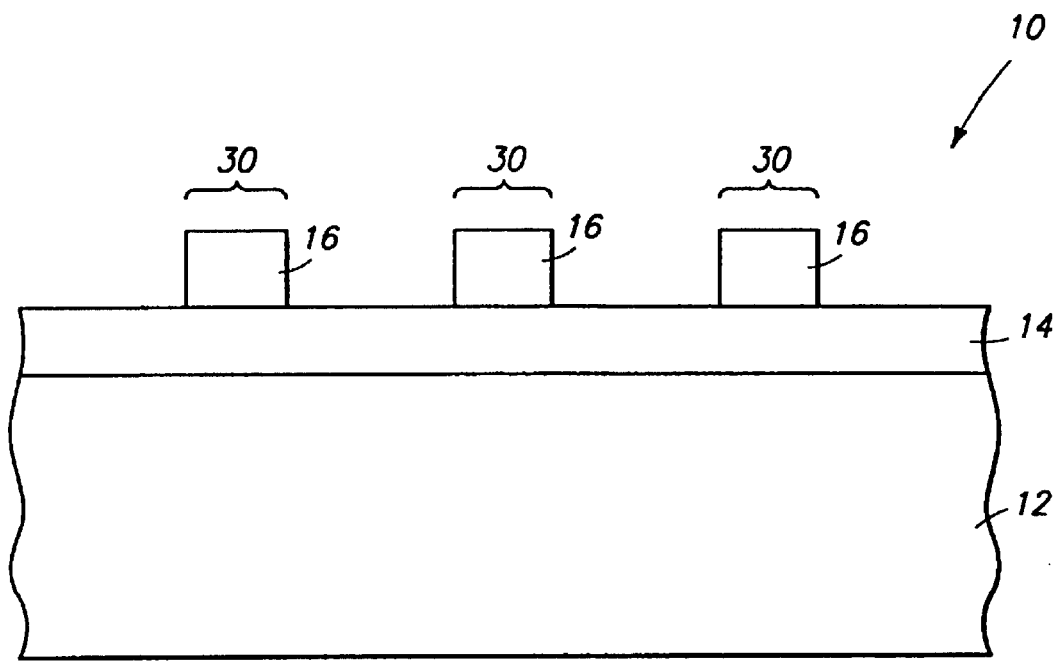
FIG. 3 is a view of the FIG. 1 wafer fragment at a step subsequent to that of FIG. 2 in accordance with a first embodiment processing method of the present invention.

This disclosure of the invention is submitted in furtherance of the constitutional purposes of the U.S. Patent Laws "to promote the progress of science and useful arts" (Article 1, Section 8).

The invention encompasses methods for utilizing energy to form patterned masking materials on a wafer. In particular aspects of the invention, the patterned masking materials are retained on a wafer after a die-cutting process. In other particular aspects of the invention, the patterned masking materials comprise silicon. The invention is described with reference to a preferred embodiment in FIGS. 1–8.

Referring to FIG. 1, a semiconductive wafer fragment 10 is illustrated at a preliminary step of a processing sequence encompassed by the present invention. Wafer fragment 10 comprises a semiconductive substrate 12. Substrate 12 can comprise, for example, monocrystalline silicon lightly doped with a p-type conductivity enhancing dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A first layer of material 14 is formed over substrate 12, and a second layer of material 16 is formed over first layer 14. The material of first layer 14 can be either a conductive material or an insulative material, and is not particularly germane to the present invention. The material of second layer 16 has physical properties which can be altered by exposure to energy. The material of second layer 16 can comprise, for example, methylsilanol $((CH_3)_y Si(OH)_{4-y})$ or silanol $(Si(OH)_4$, either of which can be formed by methods described above in the "Background" section of this disclosure. Both methylsilanol and silanol have physical properties which can be altered by exposure to, for example, electron beam energy, ultraviolet light or plasma. For instance, if portions of either silanol or methylsilanol are exposed to ultraviolet light, such portions will have a higher etch rate in hydrofluoric acid than will portions not exposed to the ultraviolet light. The exposure of methylsilanol to ultraviolet light converts it to the insulative material $(CH_3)_x SiO_{2-x}$, and exposure of silanol to ultraviolet light converts it silicon dioxide.

Referring to FIG. 2, an energy source 18 is provided over wafer fragment 10, and a patterned photolithographic mask 20 is provided between source 18 and second layer 16. Mask 20 comprises orifices 22 extending therethrough. In operation, energy 24 is emitted from source 18 and toward mask 20. In the illustrated embodiment, the energy is shown as light waves which can comprise, for example, wavelengths corresponding to ultraviolet light. Mask 20 blocks some of the light waves, while other light waves penetrate through orifices 22 to reach layer 16. Layer 16 is thus divided into portions 30 which are exposed to the radiation from source 18 and portions 32 which are shielded by mask 20 and not exposed to radiation 24. The exposure of layer 16 to radiation 24 alters physical properties of the material of layer 16 within exposed regions 30 relative to physical properties of the material in unexposed portions 32.

Figure 4:
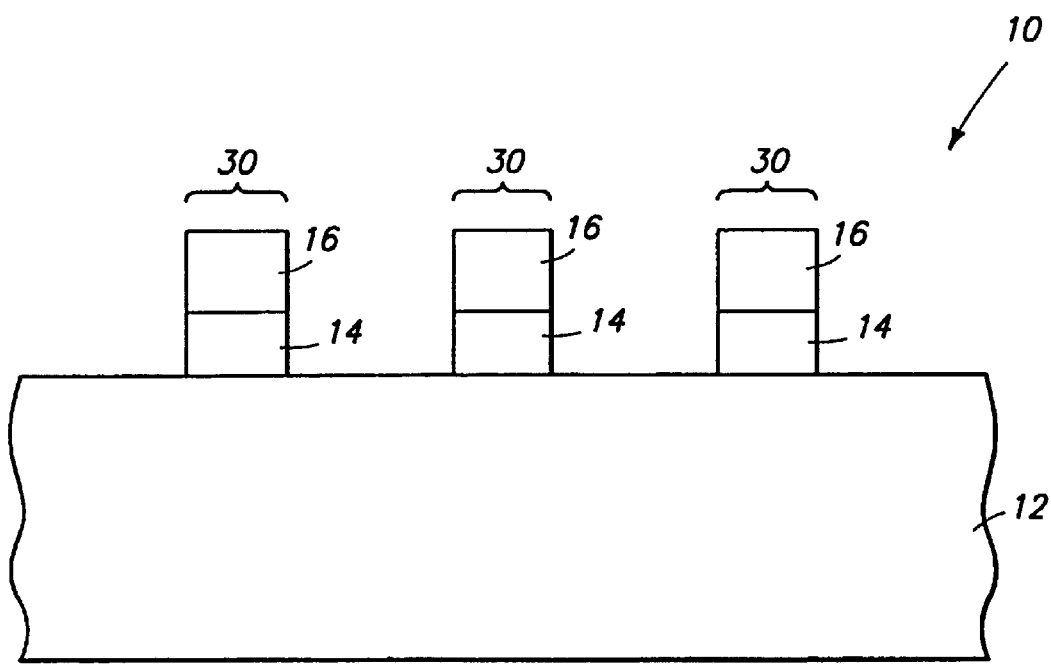
FIG. 4 is a view of the FIG. 1 wafer fragment at a processing step subsequent to that of FIG. 3.
Figure 5:
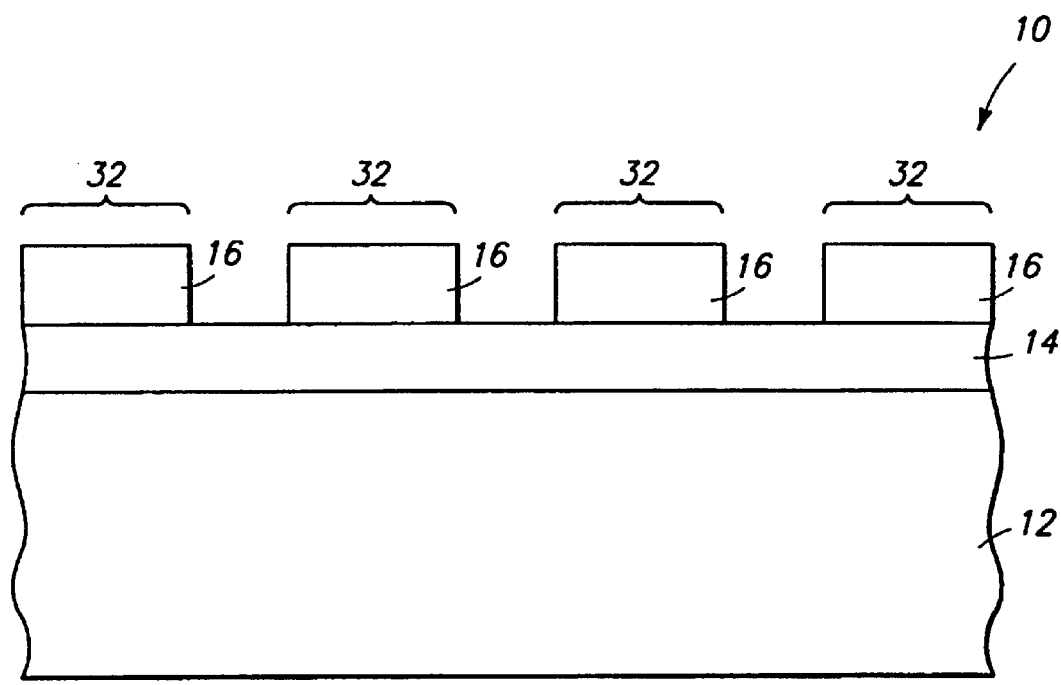
FIG. 5 is a view of the FIG. 1 wafer fragment shown at a step subsequent to that of FIG. 2, and in accordance with a second embodiment processing sequence of the present invention.
Figure 6:
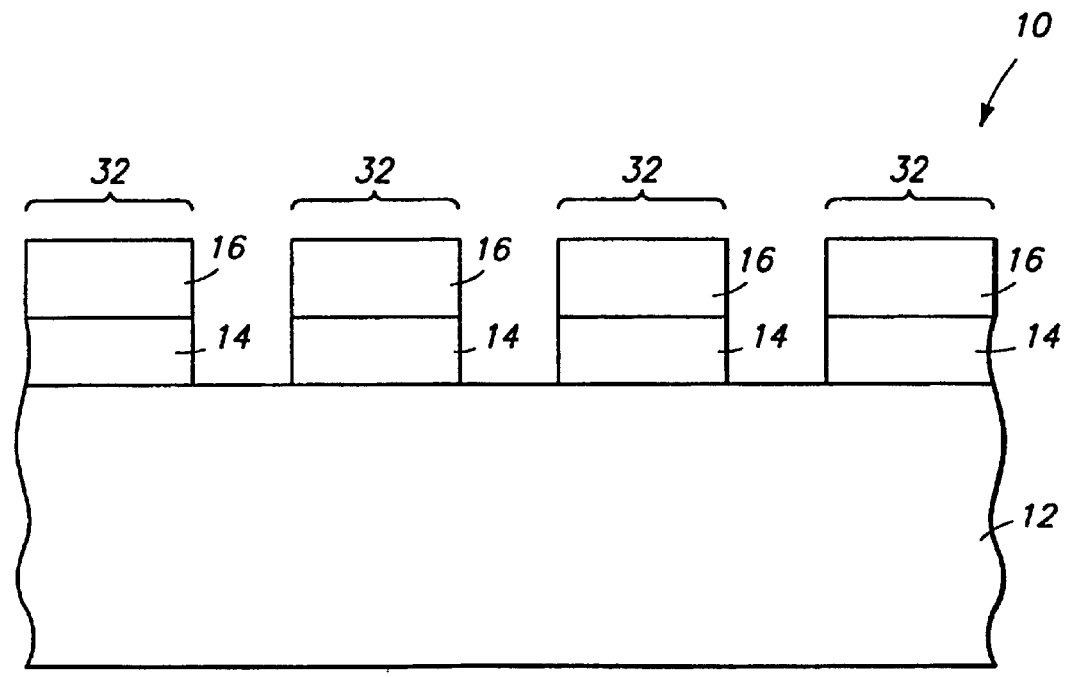
FIG. 6 is a view of the FIG. 1 wafer fragment at a processing step subsequent to that of FIG. 5.

After the exposure to radiation 24, the exposed portions 30 and unexposed portions 32 of layer 16 are exposed to common conditions which are effective to remove the material of layer 16. Further, the common conditions comprise a rate of removal of the material of layer 16 that is influenced by physical properties altered by exposure to radiation 24. Accordingly, exposed portions 30 are removed at a different rate than unexposed portions 32. FIGS. 3 and 4 illustrate an embodiment wherein exposed portions 30 are removed at a slower rate than unexposed portions 32, and FIGS. 5 and 6 illustrate an embodiment wherein the exposed portions are removed at a faster rate than the unexposed portions.

Referring first to the embodiment of FIGS. 3 and 4, and specifically referring to FIG. 3, substrate 10 is illustrated after exposure to conditions which remove exposed portions 32 (FIG. 2) more rapidly than unexposed portions 30, to leave only unexposed portions 30 remaining over first material 14. In an exemplary embodiment, the material of layer 16 can comprise either methylsilanol or silanol, the radiation 24 (FIG. 2) can comprise ultraviolet light, and the common conditions can comprise exposure to hydrofluoric acid. The ultraviolet light converts exposed material of layer 16 to either methylsilicon dioxide or silicon dioxide, and thus renders such exposed portions more resistant to hydrofluoric acid removal than unexposed portions comprising either methylsilanol or silanol. In the exemplary embodiment, it is found that the portions of a methylsilanol or silanol layer 16 exposed to ultraviolet light are removed by hydrofluoric acid at a rate that is at least about 5 times slower than portions of layer 16 not exposed to ultraviolet light. The portions not exposed to ultraviolet light can thus be selectively removed relative to the portions that have been exposed to ultraviolet light. For purposes of interpreting this disclosure and the claims that follow, a first material is "selectively removed" relative to another material if the first material is removed at a rate that is at least 3 times faster than a rate at which the other material is removed.

Referring to FIG. 4, a pattern is transferred from exposed portions 30 to underlying layer 14. Specifically, portions of layer 14 are removed by an etch. The conditions of the etch will vary depending on the material of layer 14, and can comprise conventional methods which will be recognized by persons of ordinary skill in the art for utilization with various materials of layer 14.

Referring to 5 and 6, processing similar to that of FIGS. 3 and 4 is illustrated with the exception that it is exposed portions 30 (FIG. 2) that have a faster rate of removal than unexposed portions 32 when layer 16 is subjected to conditions for removing the material of layer 16.

An advantage of the present invention relative to prior art methods described above in the "Background" section of this disclosure is that the photolithographically patterned layer 16 does not comprise photoresist. Accordingly, layer 16 can have attributes desired in structures formed over substrate 12. For instance, in the abovedescribed exemplary embodiment of FIGS. 3 and 4, the remaining portions 30 of layer 16 comprise an insulative material (either silicon dioxide or methylsilicon oxide). Such insulative material can be utilized for separating conductive components of a semiconductor circuit from one another. In some applications, the methylsilicon oxide can be more preferred than the silicon dioxide, as methylsilicon oxide has a lower dielectric constant than silicon oxide. Accordingly, methylsilicon oxide can reduce parasitic capacitance between adjacent conductive components relative to silicon dioxide. The advantages of utilizing methylsilicon oxide can be generally realized from silicon oxides having the generic formula R—Si—O, wherein R is an organic group. R can comprise, for example, a hydrocarbon group.

FIGS. 7 and 8 illustrate subsequent processing which can occur after the processing of either FIGS. 3 and 4, or the processing of FIGS. 5 and 6. Specifically, FIG. 7 is a view of an entirety of a semiconductive wafer 50 which has been processed. The semiconductive wafer has a plurality of semiconductor structures (e.g., circuitry) formed thereover (not shown) and is subdivided into circuit packages 52 (only some of which are labeled). Imaginary dashed lines 53 are provided to show boundaries between adjacent semiconductor circuit packages 52. For reasons discussed above, structures comprised by packages 52 can comprise portions of photolithographically patterned layer 16 incorporated therein.

Referring to FIG. 8, wafer fragment 50 (FIG. 7) is illustrated after being subjected to a die-cutting process, wherein the wafer has been cut into separated die corresponding to packages 52.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method, comprising:
    forming a layer of material comprising oxygen, as initially deposited, over a semiconductive wafer substrate;
    exposing some portions of the layer to energy while leaving other portions unexposed, the exposing altering physical properties of the exposed portions of material relative to the unexposed portions of material;
    after the exposing, subjecting the exposed and unexposed portions of the layer to common conditions, the common conditions being effective to remove the material and comprising a rate of removal that is influenced by the altered physical properties of the layer, the common conditions removing either the exposed or unexposed portions faster than the other of the exposed and unexposed portions; and
    after the selective removal of the exposed or unexposed portions, and while the other of the exposed and unexposed portions remains over the substrate, cutting the wafer into separated die.

2. The method of claim 1 wherein the material comprises silicon.

3. The method of claim 1 wherein the material comprises carbon, silicon and oxygen.

4. The method of claim 1 wherein the material comprises silicon bound to a hydrocarbon group and bound to oxygen.

5. The method of claim 1 wherein the material comprises $(CH_3)_y Si(OH)_{4-y}$, with y being greater than 0 and less than 4.

6. The method of claim 1 wherein the material comprises $Si(OH)_4$.

7. The method of claim 1 wherein the energy is in the form of ultraviolet light.

8. The method of claim 1 wherein the energy is in the form of an electron beam.

9. The method of claim 1 wherein the energy is in the form of a plasma.

10. The method of claim 1 wherein the forming a layer comprises depositing a layer of material comprising $(CH_3)_y Si(OH)_{4-y}$, as initially deposited, with y being greater than 0 and less than 4.

11. The method of claim 1 wherein the forming a layer comprises depositing a layer of material comprising $Si(OH)_4$, as initially deposited.

12. A semiconductor processing method, comprising:
    depositing a layer of material comprising silicon and oxygen, as initially deposited, over a substrate;
    exposing some portions of the layer to energy while leaving other portions unexposed, the exposing altering physical properties of the exposed portions relative to the unexposed portions; and
    after the exposing, subjecting the exposed and unexposed portions of the layer to common conditions, the common conditions being effective to remove the silicon-comprising material and comprising a rate of removal that is influenced by the altered physical properties of the layer, the common conditions removing either the exposed or unexposed portions faster than the other of the exposed and unexposed portions.

13. The method of claim 12 wherein the silicon-comprising material comprises carbon, silicon and oxygen.

14. The method of claim 12 wherein the silicon-comprising material comprises silicon bound to a hydrocarbon group and bound to oxygen.

15. The method of claim 12 wherein the silicon-comprising material comprises silicon bound to a hydrocarbon group and bound to oxygen, and wherein the hydrocarbon group does not comprise a carbon-containing ring.

16. The method of claim 12 wherein the silicon-comprising material comprises $(CH_3)_y Si(OH)_{4-y}$, with y being greater than 0 and less than 4.

17. The method of claim 12 wherein the silicon-comprising material comprises $Si(OH)_4$.

18. The method of claim 12 wherein the energy is in the form of ultraviolet light.

19. The method of claim 12 wherein the energy is in the form of an electron beam.

20. The method of claim 12 wherein the energy is in the form of a plasma.

21. The method of claim 12 wherein the silicon-comprising material comprises $(CH_3)_y Si(OH)_{4-y}$, with y being greater than 0 and less than 4 and the energy is in the form of ultraviolet light; and wherein:

the exposing comprises passing the ultraviolet light through openings in a patterned mask and onto the layer of material to expose said some portions of the layer to the ultraviolet light while leaving said other portions unexposed; and the common conditions comprising subjecting the entire layer to hydrofluoric acid, the hydrofluoric acid removing portions of the layer that were not exposed to ultraviolet light at a faster rate than portions of the layer that were exposed to ultraviolet light.

22. The method of claim 12 wherein the silicon-comprising material comprises $Si(OH)_4$ and the energy is in the form of ultraviolet light; and wherein:

the exposing comprises passing the ultraviolet light through openings in a patterned mask and onto the layer of material to expose said some portions of the layer to the ultraviolet light while leaving said other portions unexposed; and the common conditions comprising subjecting the entire layer to a solvent comprising hydrofluoric acid, the hydrofluoric acid removing portions of the layer that were not exposed to ultraviolet light at a faster rate than portions of the layer that were exposed to ultraviolet light.

23. The method of claim 12 wherein the silicon-comprising material comprises $Si(OH)_4$ and the energy is in the form of an electron beam; and wherein:

the exposing comprises exposing said some portions of the layer to the electron beam while leaving said other portions unexposed; and the common conditions comprising subjecting the entire layer to hydrofluoric acid, the hydrofluoric acid removing portions of the layer that were not exposed to the electron beam at a faster rate than portions of the layer that were exposed to the electron beam.

24. A semiconductor processing method, comprising:

depositing a layer comprising $(CH_3)_y Si(OH)_{4-y}$, as initially deposited, with y being greater than 0 and less than 4, over a substrate;

exposing some portions of the layer to ultraviolet light while leaving other portions unexposed, the exposing converting the exposed portions to $(CH3)_x SiO_{2-x}$, with x being greater than 0 and less than 2; and after the exposing, subjecting the exposed and unexposed portions of the layer to hydrofluoric acid to selectively remove the $(CH_3)_y Si(OH)_{4-y}$ of the unexposed portions relative to the $(CH_3)_x SiO_{2-x}$ of the exposed portions.

25. The method of claim 24 wherein the ultraviolet light is passed onto the layer of $(CH_3)_y Si(OH)_{4-y}$ through openings in a patterned mask.

26. The method of claim 24 wherein the substrate is a semiconductive wafer, and further comprising:

after the selective removal of the $(CH_3)_y Si(OH)_{4-y}$ of the unexposed portions, and while the $(CH_3)_x SiO_{2-x}$ of the exposed portions remains over the substrate, cutting the wafer into separated die.

27. A semiconductor processing method, comprising:

depositing a layer comprising $Si(OH)_4$, as initially deposited, over a substrate;

exposing some portions of the layer to energy while leaving other portions unexposed, the exposing converting the exposed portions to $SiO_2$; and after the exposing, subjecting the exposed and unexposed portions of the layer to hydrofluoric acid to selectively remove the $Si(OH)_4$ of the unexposed portions relative to the $SiO_2$ of the exposed portions.

28. The method of claim 27 wherein the energy is in the form of ultraviolet light.

29. The method of claim 27 wherein the energy is in the form of ultraviolet light and is passed onto the layer of $Si(OH)_4$ through openings in a patterned mask.

30. The method of claim 27 wherein the energy is in the form of an electron beam.

31. The method of claim 27 wherein the substrate is a semiconductive wafer, and further comprising:

after the selective removal of the $Si(OH)_4$ of the unexposed portions, and while the $SiO_2$ of the exposed portions remains over the substrate, cutting the wafer into separated die.

* * * * *

UNITED STATES PATENT AND TRADEMARK OFFICE
CERTIFICATE OF CORRECTION

| | | |
|---|---|---|
| PATENT NO. | : 7,235,499 B1 | Page 1 of 1 |
| APPLICATION NO. | : 09/234233 | |
| DATED | : June 26, 2007 | |
| INVENTOR(S) | : Li et al. | |

It is certified that error appears in the above-identified patent and that said Letters Patent is hereby corrected as shown below:

In column 8, line 7, in Claim 24, delete "$(CH3)_x SiO_{2-x}$" and insert -- $(CH_3)_x SiO_{2-x}$ --, therefor.

Signed and Sealed this

Fourth Day of December, 2007

JON W. DUDAS
*Director of the United States Patent and Trademark Office*